(12) United States Patent
Fan et al.

(10) Patent No.: US 8,637,908 B2
(45) Date of Patent: Jan. 28, 2014

(54) BORDERLESS CONTACTS IN SEMICONDUCTOR DEVICES

(75) Inventors: Su Chen Fan, Cohoes, NY (US); David V. Horak, Essex Junction, VT (US); Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 13/188,789

(22) Filed: Jul. 22, 2011

(65) Prior Publication Data

US 2013/0020615 A1    Jan. 24, 2013

(51) Int. Cl.
*H01L 29/66* (2006.01)
*H01L 21/44* (2006.01)

(52) U.S. Cl.
USPC .............. 257/272; 257/E21.158; 257/E29.31; 438/675

(58) Field of Classification Search
USPC .............. 257/272, E21.158, E29.31; 438/675
See application file for complete search history.

(56) References Cited

U.S. PATENT DOCUMENTS

| | | | |
|---|---|---|---|
| 5,998,252 A | 12/1999 | Huang | |
| 6,448,140 B1 | 9/2002 | Liaw | |
| 6,465,312 B1 | 10/2002 | Yu | |
| 6,475,847 B1 * | 11/2002 | Ngo et al. ..................... | 438/201 |
| 7,329,912 B2 | 2/2008 | Yaung | |
| 7,582,567 B1 | 9/2009 | Syau et al. | |
| 7,615,831 B2 | 11/2009 | Zhu et al. | |
| 7,659,171 B2 | 2/2010 | Furukawa et al. | |
| 7,855,126 B2 * | 12/2010 | Shin et al. ..................... | 438/429 |
| 2008/0157091 A1 * | 7/2008 | Shin et al. ..................... | 257/66 |
| 2008/0280391 A1 | 11/2008 | Shin et al. | |
| 2010/0038715 A1 | 2/2010 | Babich et al. | |
| 2010/0038723 A1 | 2/2010 | Babich et al. | |
| 2012/0025317 A1 | 2/2012 | Zhong et al. | |
| 2012/0267706 A1 * | 10/2012 | Luo et al. ..................... | 257/329 |

OTHER PUBLICATIONS

Guo et al., pending U.S. Appl. No. 12/755,752 entitled "Self-Aligned Contacts," filed Apr. 9, 2010 with the U.S. Patent and Trademark Office.
Wei et al., A Scalable Self-Aligned Contact NOR Flash Technology, IEEE Symposium on VLSI Technology, Jun. 12-14, 2007, pp. 226-227.

* cited by examiner

*Primary Examiner* — Wensing Kuo
*Assistant Examiner* — Moazzam Hossain
(74) *Attorney, Agent, or Firm* — Cantor Colburn LLP; Vazken Alexanian

(57) ABSTRACT

A method includes depositing a dummy fill material over exposed portions of a substrate and a gate stack disposed on the substrate, removing portions of the dummy fill material to expose portions of the substrate, forming a layer of spacer material over the exposed portions of the substrate, the dummy fill material and the gate stack, removing portions of the layer of spacer material to expose portions of the substrate and the dummy fill material, depositing a dielectric layer over the exposed portions of the spacer material, the substrate, and the gate stack, removing portions of the dielectric layer to expose portions of the spacer material, removing exposed portions of the spacer material to expose portions of the substrate and define at least one cavity in the dielectric layer, and depositing a conductive material in the at least one cavity.

2 Claims, 12 Drawing Sheets

BORDERLESS CONTACTS IN SEMICONDUCTOR DEVICES

FIELD

The present invention relates generally to semiconductor devices, and more specifically, to borderless contacts in semiconductor devices.

DESCRIPTION OF RELATED ART

Semiconductor devices such as field effect transistors (FETs) often include a gate stack and source and drain regions. The gate stack and source and drain regions are often covered with a dielectric capping material that insulates the FETs. Conductive vias are often formed by a photolithographic patterning and etching process that forms cavities in the dielectric capping material that expose the source and drain regions of the FETs. The cavities are filled with a conductive material.

BRIEF SUMMARY

According to one embodiment of the present invention, a method includes depositing a dummy fill material over exposed portions of a substrate and a gate stack disposed on the substrate, removing portions of the dummy fill material to expose portions of the substrate, forming a layer of spacer material over the exposed portions of the substrate, the dummy fill material and the gate stack, removing portions of the layer of spacer material to expose portions of the substrate and the dummy fill material, depositing a dielectric layer over the exposed portions of the spacer material, the substrate, and the gate stack, removing portions of the dielectric layer to expose portions of the spacer material, removing exposed portions of the spacer material to expose portions of the substrate and define at least one cavity in the dielectric layer, and depositing a conductive material in the at least one cavity.

According to another embodiment of the present invention, a method includes depositing a dummy fill material over exposed portions of a substrate, a first gate stack disposed on the substrate, and a second gate stack disposed on the substrate, removing portions of the dummy fill material to expose portions of the substrate and the second gate stack, forming a layer of spacer material over the exposed portions of the substrate, the dummy fill material and the second gate stack, removing portions of the layer of spacer material to expose portions of the substrate and the dummy fill material, depositing a dielectric layer over the exposed portions of the spacer material, the substrate, the first gate stack and the second gate stack, removing portions of the dielectric layer to expose portions of the spacer material, removing exposed portions of the spacer material to expose portions of the substrate and define at least one cavity in the dielectric layer, and depositing a conductive material in the at least one cavity, the conductive fill material forming a via contacting an active region of the field effect transistor device.

According to yet another embodiment of the present invention, a field effect transistor device includes a first gate stack disposed on a substrate, a first spacer including a first spacer material disposed adjacent to the first gate stack, a second spacer including a second spacer material disposed adjacent to the first spacer, a second gate stack disposed on the substrate, an active region arranged between the first gate stack and the second gate stack, a third spacer including the first spacer material disposed adjacent to the second gate stack, a polysilicon layer disposed over portions of the substrate, the active region, the first gate stack, the first spacer, the second spacer, the second gate stack, and the third spacer, and a conductive material disposed in a cavity of the polysilicon layer, the conductive material contacting the active region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The photolithographic process used to define cavities that define conductive vias in field effect transistor (FET) devices often uses dark field reticles with multiple eccentricities, which may result in an undesirably narrow print process window. The desired aspect ratio (the depth of the cavity to the width of the cavity) of the etched cavities is often a high ratio. Achieving a high aspect ratio using a selective etching process to remove portions of the dielectric capping material without removing portions of the underlying FETs is often difficult with reductions in the scale of the semiconductor architecture.

Figure 1A:
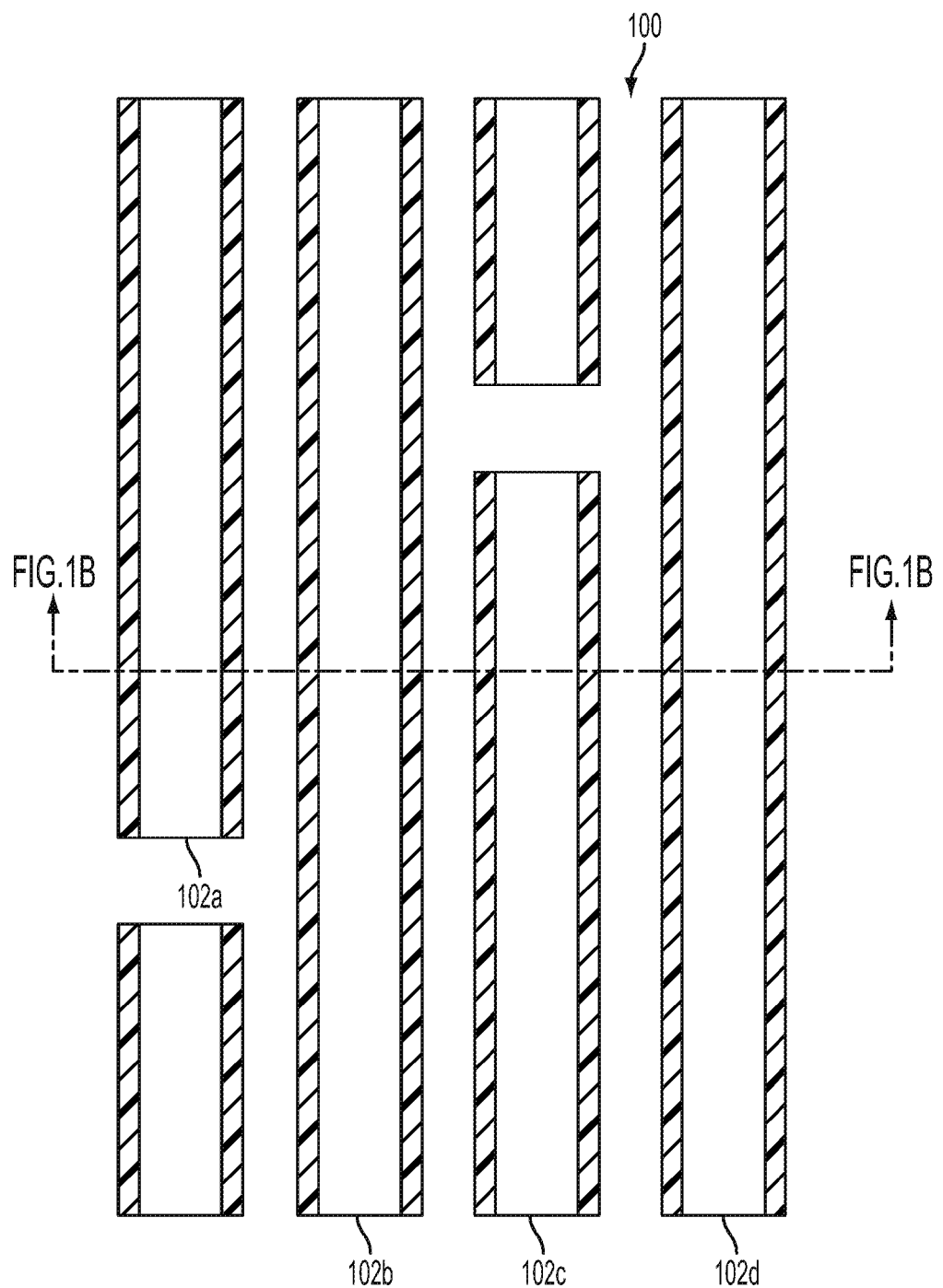
FIG. 1A illustrates a top-down view of a FET arrangement that includes gate stacks arranged on a substrate.
Figure 1B:
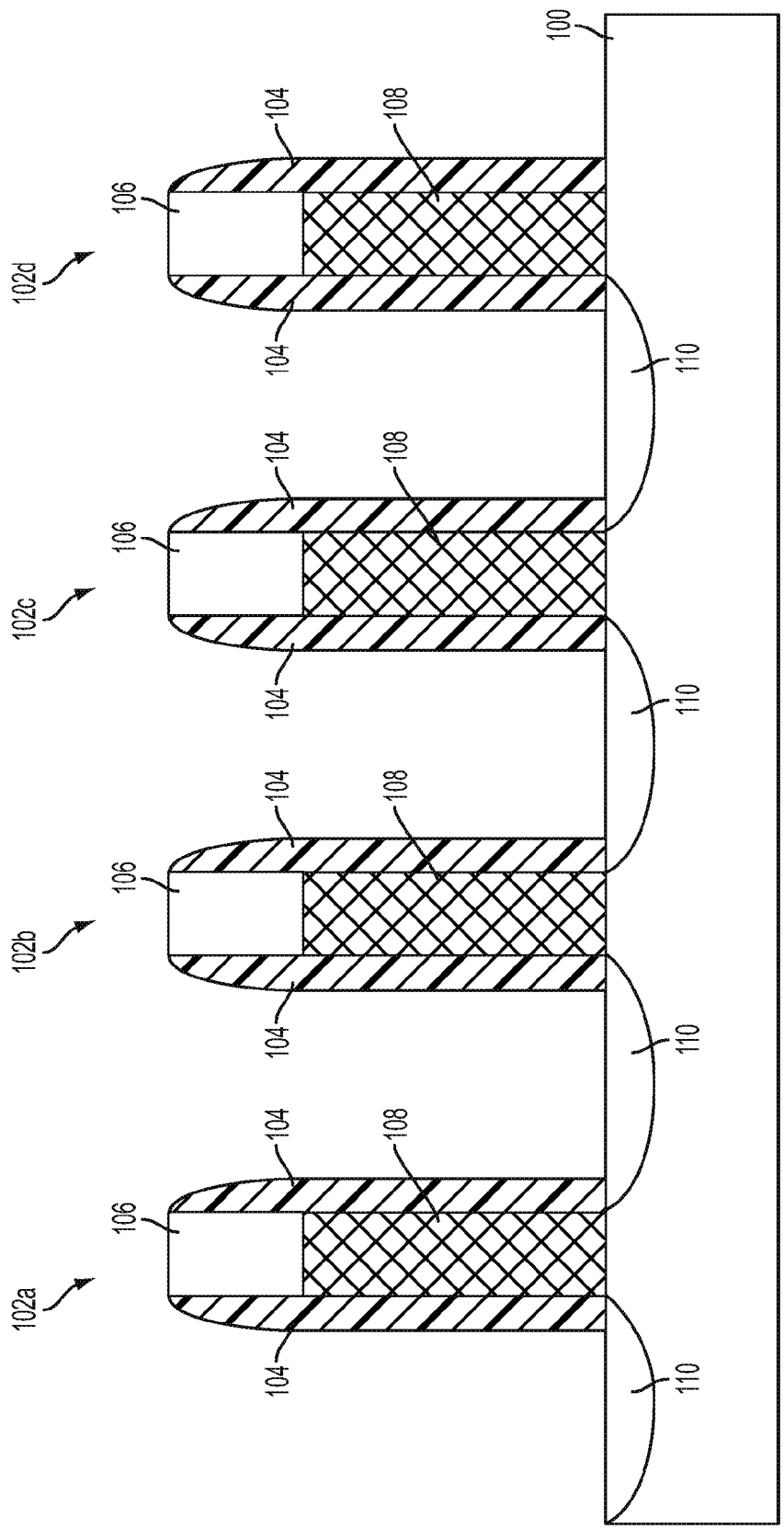
FIG. 1B illustrates a side cut-away view of the FET arrangement along the line 1B of FIG. 1A.

FIGS. 1A-10B described below illustrate an exemplary method for forming conductive vias for FET devices (semiconductor devices). FIG. 1A illustrates a top-down view of a FET arrangement that includes FETs 102 (102a, 102b, 102c, and 102d) having gate stacks 108 arranged on a substrate 100 that may include a silicon trench isolation region surrounding at least a portion of the gate stacks. FIG. 1B illustrates a side cut-away view of the FET arrangement along the line 1B (of FIG. 1A). The illustrated embodiment includes an arrangement of planar FETs; however, alternate embodiments may include other types of FET devices such as for example, FinFET devices, or other multi-gate FET devices such as nanowire FET devices or gate-all-around FET devices. Referring to FIG. 1B, the FET devices 102 are arranged on the substrate 100 that may include, for example, a silicon material. The FET devices 102 include gate stack portions 108 that may include for example, a metallic layer portion and a dielectric portion. The gate stack portions 108 are capped with a capping layer 106 that may include, for example, any insulating dielectric material such as Si3N4, SiO2, metal oxide or metal nitride. The FET devices 102 may include spacers 104 arranged adjacent to the gate stack portions 108. The spacers 104 may include, for example, a nitride or oxide material. The FET devices 102 include active regions 110 that may serve as a source or drain region. In the illustrated embodiment, the active regions 110 are formed in the substrate 100; however, in alternate embodiments, the active regions 110 may be formed in, for example, fins or nanowires that may be disposed on or above the substrate 110. The active region 110 may be formed from, for example, a silicon material or a silicon on insulator (SOI) substrate. The FET devices 102 may be formed using any suitable methods that may include, for example, combinations of photolithographic patterning processes, material deposition processes, epitaxial growth processes, and material etching processes. The active regions 110 may include a silicide material (not shown) that may be formed by, for example, depositing a conductive material on the active regions 110 and performing an annealing process.

Figure 2:
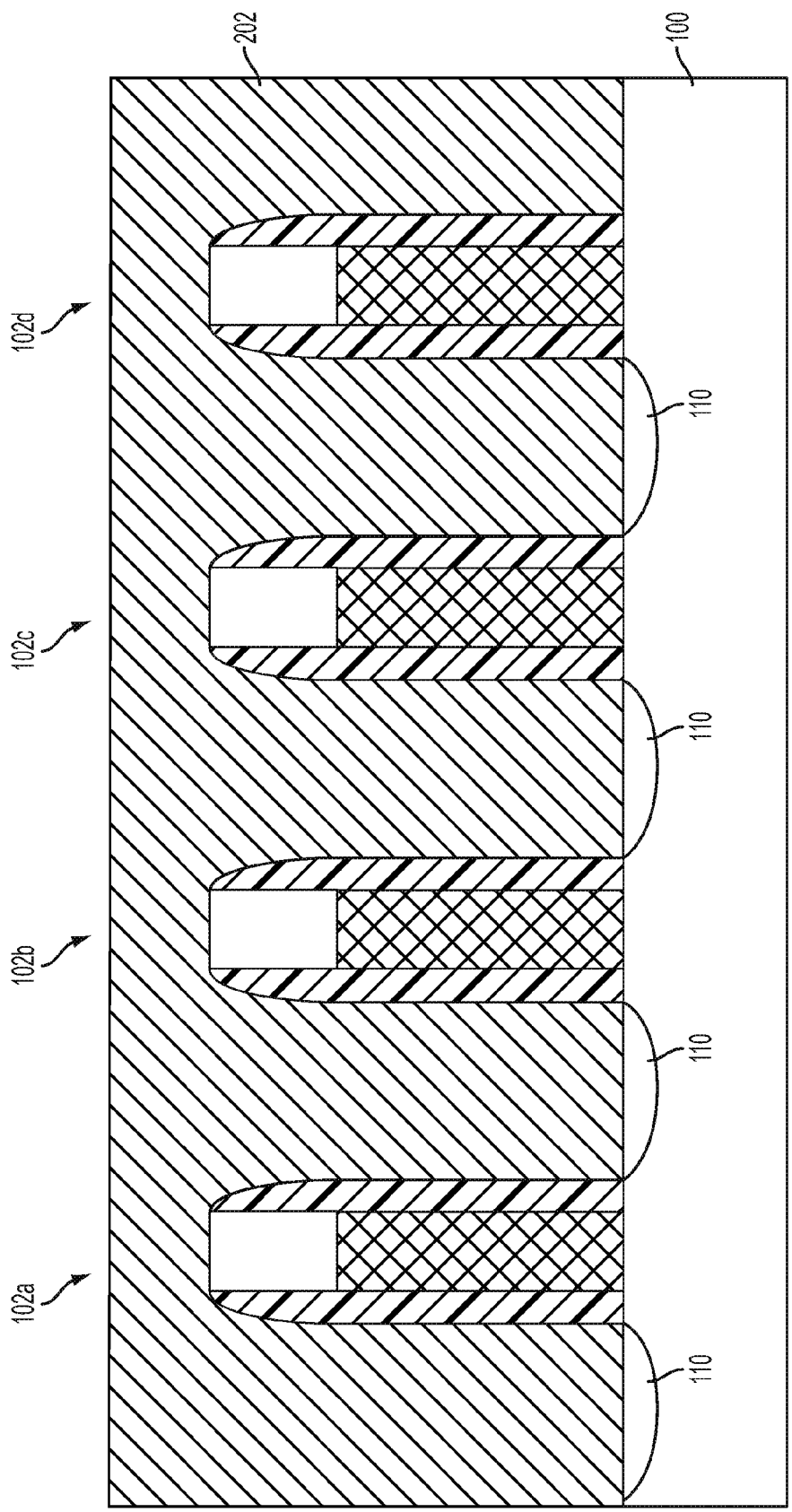
FIG. 2 illustrates a side cut-away view of the resultant structure following the deposition of a dummy fill material.

FIG. 2 illustrates a side cut-away view of the resultant structure following the deposition of a dummy fill material 202 over the gate stacks 108 and the exposed portions of the substrate 100. The dummy fill material 202 may include, for example, an amorphous silicon material, amorphous carbon material, spin-on-dielectric oxide, low-k materials, organic materials, or silicon oxide materials, and may be deposited using, for example, a chemical vapor deposition (CVD) or a plasma enhanced chemical vapor deposition (PECVD) process.

Figure 3:
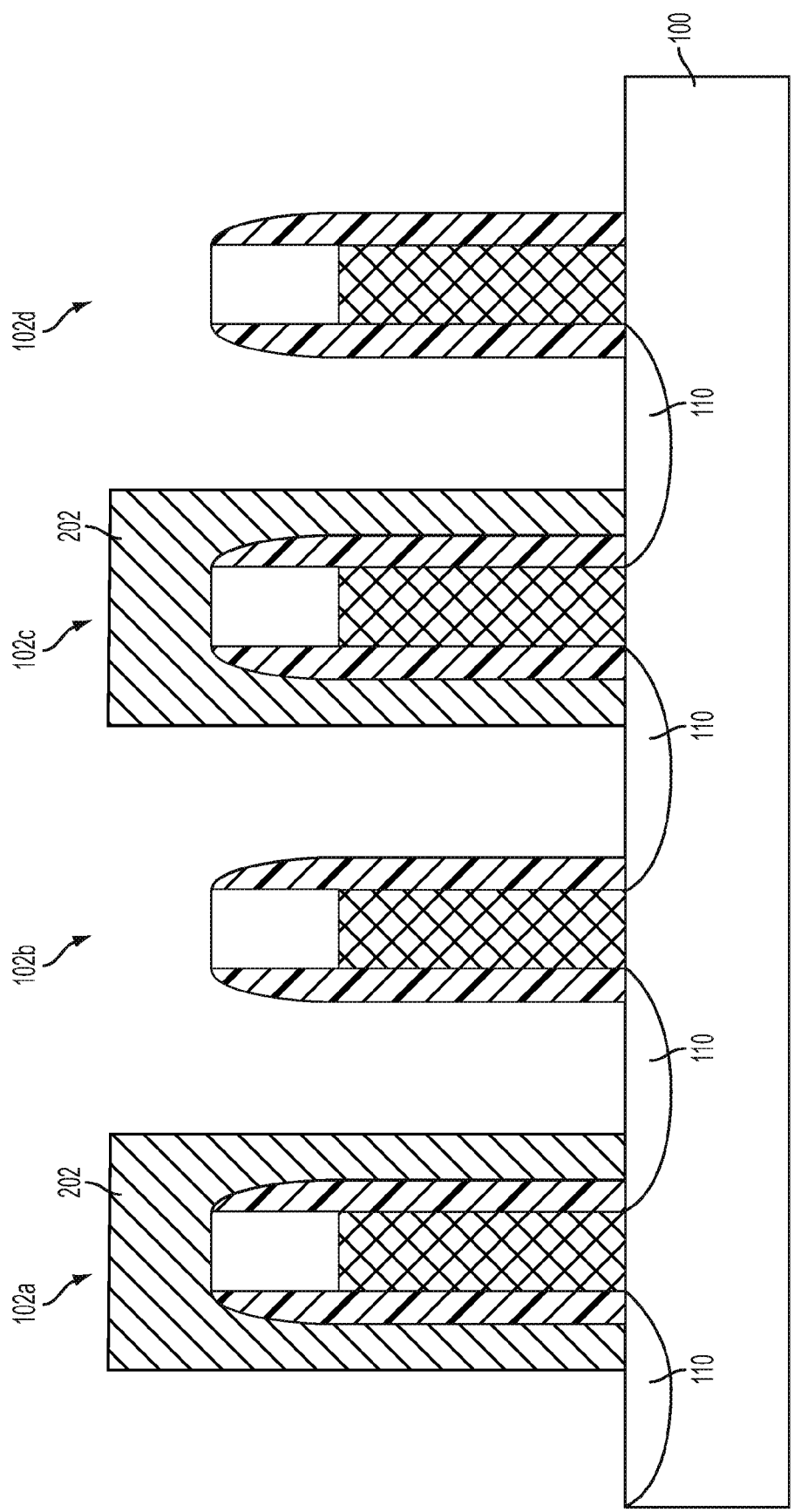
FIG. 3 illustrates the resultant structure following the removal of portions of the dummy fill material.

FIG. 3 illustrates the resultant structure following the removal of portions of the dummy fill material 202. The portions of the dummy fill material 202 may be removed by, for example, a lithographic patterning and etching process using an anisotropic etching process such as reactive ion etching (RIE). The etching process exposes portions of the substrate 100 and the gate stacks 108 of FET devices 102*b* and 102*d*.

Figure 4:
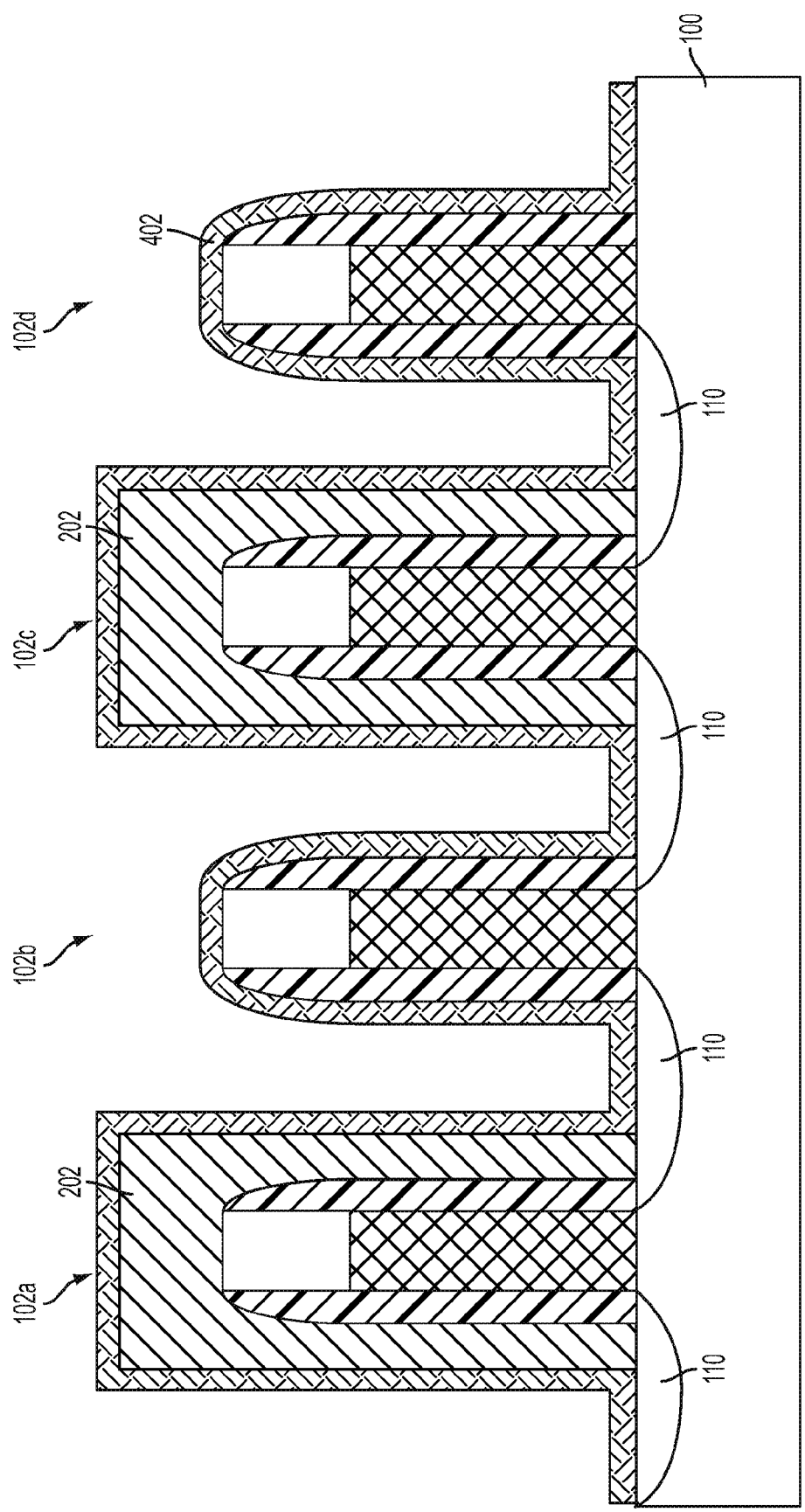
FIG. 4 illustrates the deposition of a layer of spacer material.

FIG. 4 illustrates the deposition of a layer of spacer material 402. The spacer material 402 is deposited over the exposed portions of the substrate, the dummy fill material 202 and the gate stacks 108 of the FET devices 102*b* and 102*d*. The spacer material 402 may include, for example, an oxide or a nitride material and may be deposited using, for example, a CVD or PECVD process. In the illustrated embodiment, the spacer material 402 includes a material that is different from the dummy fill material 202. For example, if the dummy fill material 202 is an oxide material, than the spacer material 402 may include a nitride material. If the dummy fill material 202 is a spin-on-organic material such as a photoresist material, than the spacer material 402 may include an oxide or nitride material. Other combinations of appropriate dissimilar materials may be used and are not limited to the examples described above.

Figure 5:
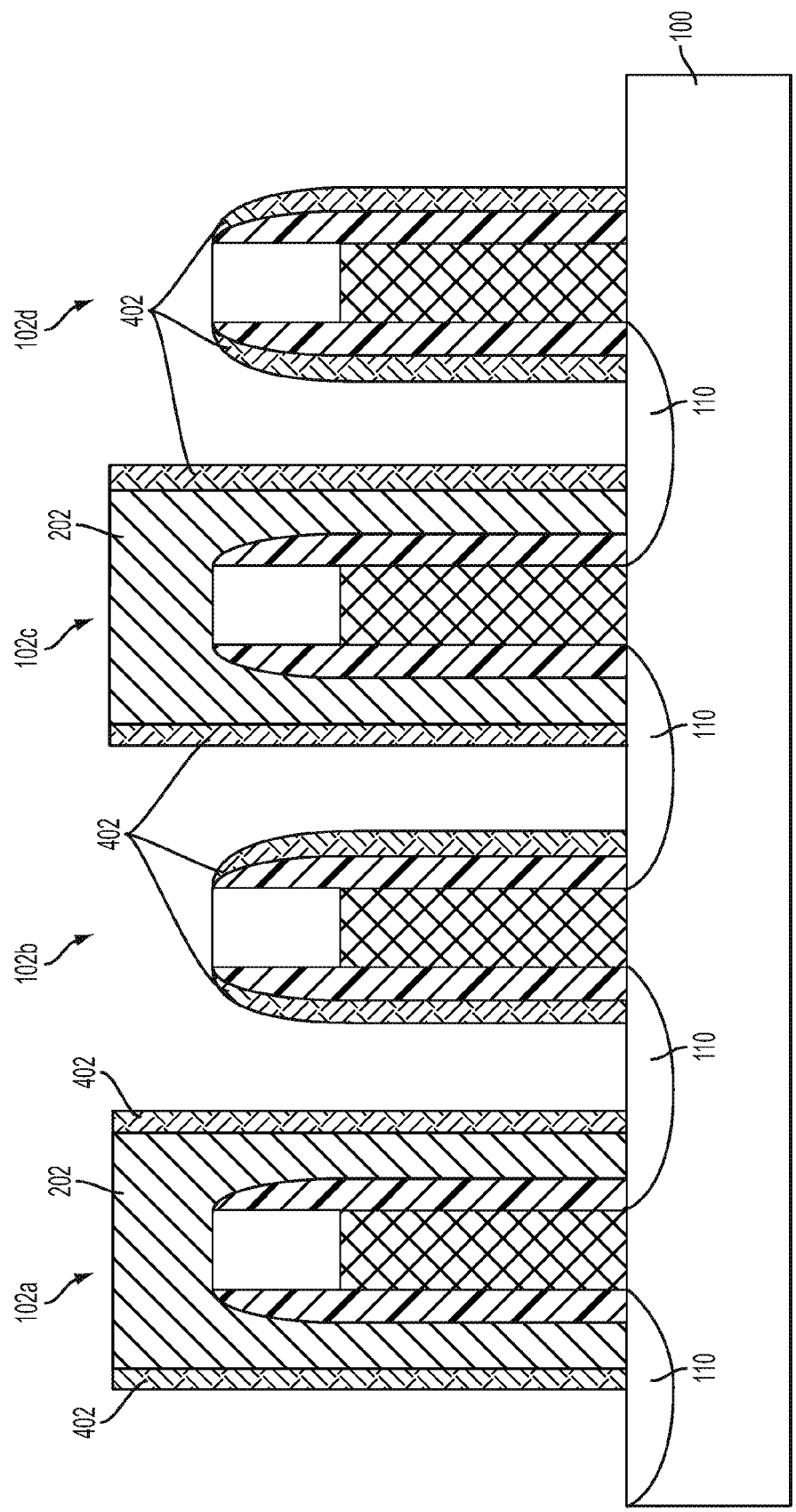
FIG. 5 illustrates the resultant structure following the removal of portions of the spacer material.

FIG. 5 illustrates the resultant structure following the removal of horizontal portions of the spacer material 402 using an anisotropic etching process such as, for example, a RIE or wet etching process that leaves remaining portions of the spacer material 402 on vertical sidewalls of the patterned dummy fill material 202 and spacers 104 where no dummy fill material 202 is present. The etching process exposes top surface portions of the dummy fill material 202 and the substrate 100.

Figure 6:
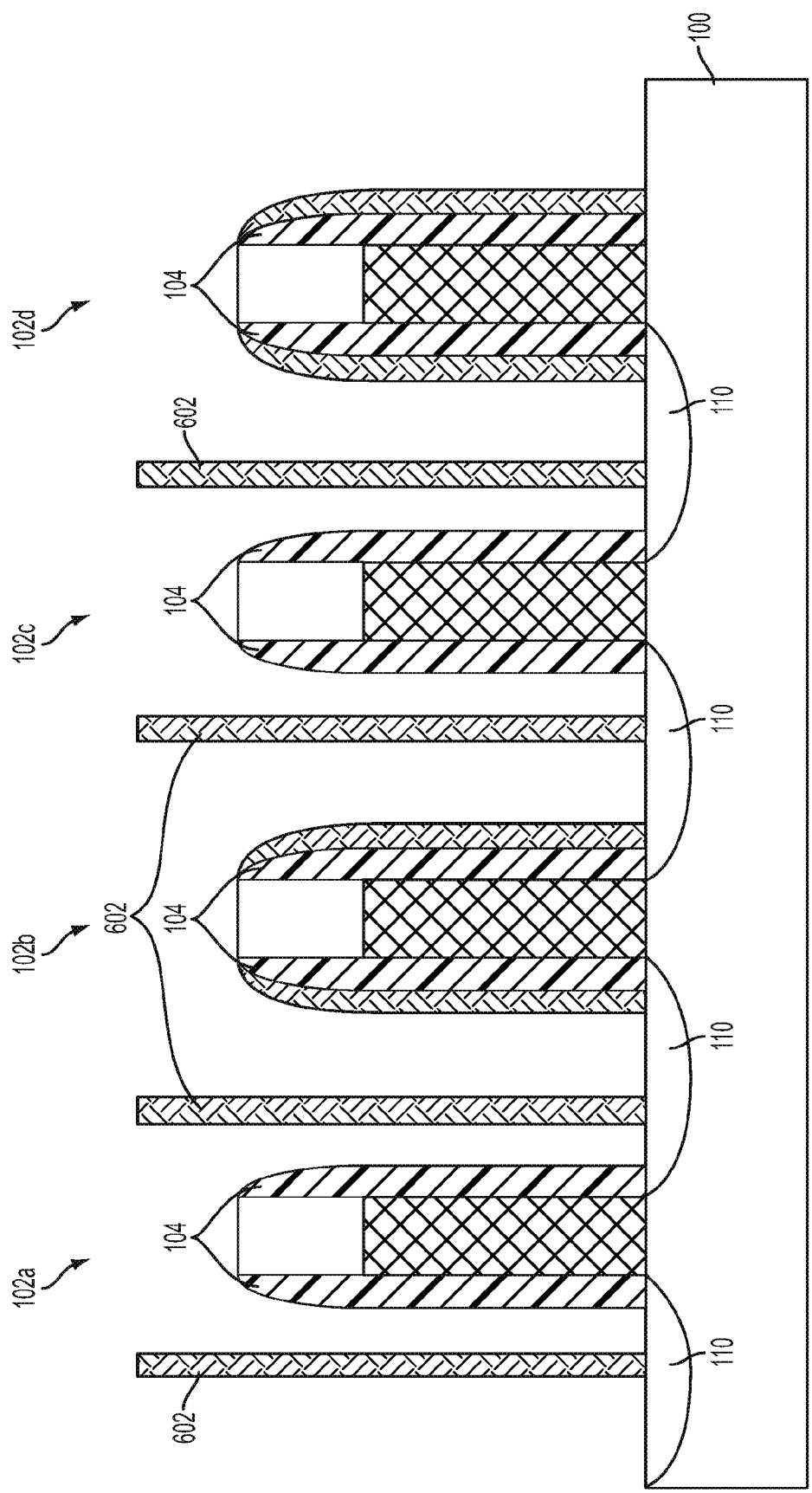
FIG. 6 illustrates the resultant structure following an etching process that removes the exposed portions of the dummy fill material.

FIG. 6 illustrates the resultant structure following a selective etching process that removes the exposed portions of the dummy fill material 202 (of FIG. 5). The etching process may include, for example, a wet etching process, a dry etching process, or a combination of etching processes to selectively remove the dummy fill material 202. The removal of the dummy fill material 202 exposes the gate stacks 108 of the FET devices 102*a* and 102*c* and portions of the substrate 100. The removal of the dummy fill material 202 results in the illustrated arrangement of the sacrificial spacers 602. The sacrificial spacers are arranged on active regions 110 of the substrate 100. The sacrificial spacers 602 are vertically disposed and spaced apart from the spacers 104.

Figure 7:
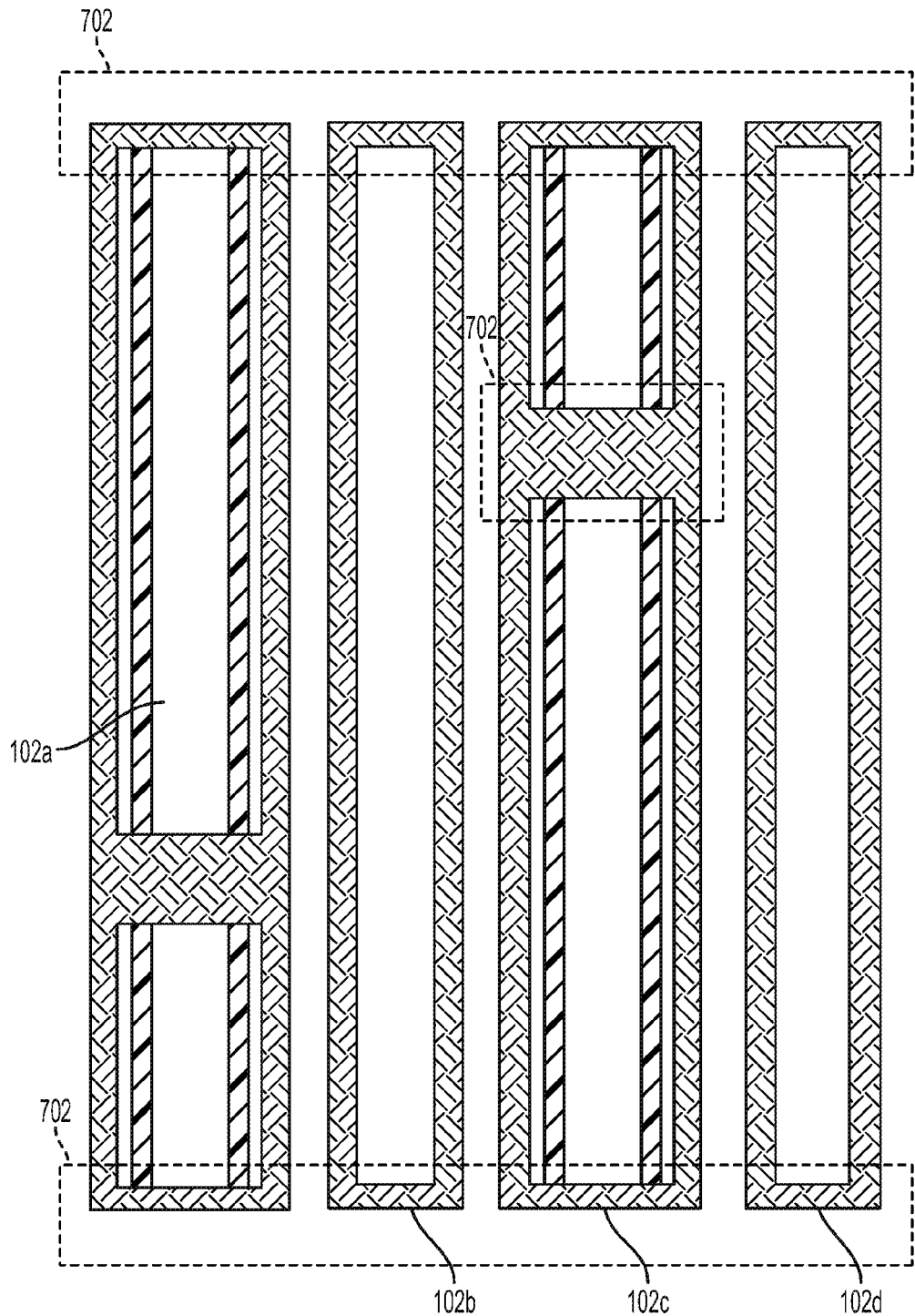
FIG. 7 illustrates a top-down view of the arrangement of FIG. 6.

FIG. 7 illustrates a top-down view of the arrangement of FIG. 6. The illustrated embodiment includes regions 702 that are removed following a photolithographic patterning and etching process such as, for example, RIE. In this regard, a photolithographic patterning process forms a mask over the arrangement with the exception of the regions 702. The etching process removes the spacer material 402 and in some embodiments portions of the gate stacks 108.

Figure 8:
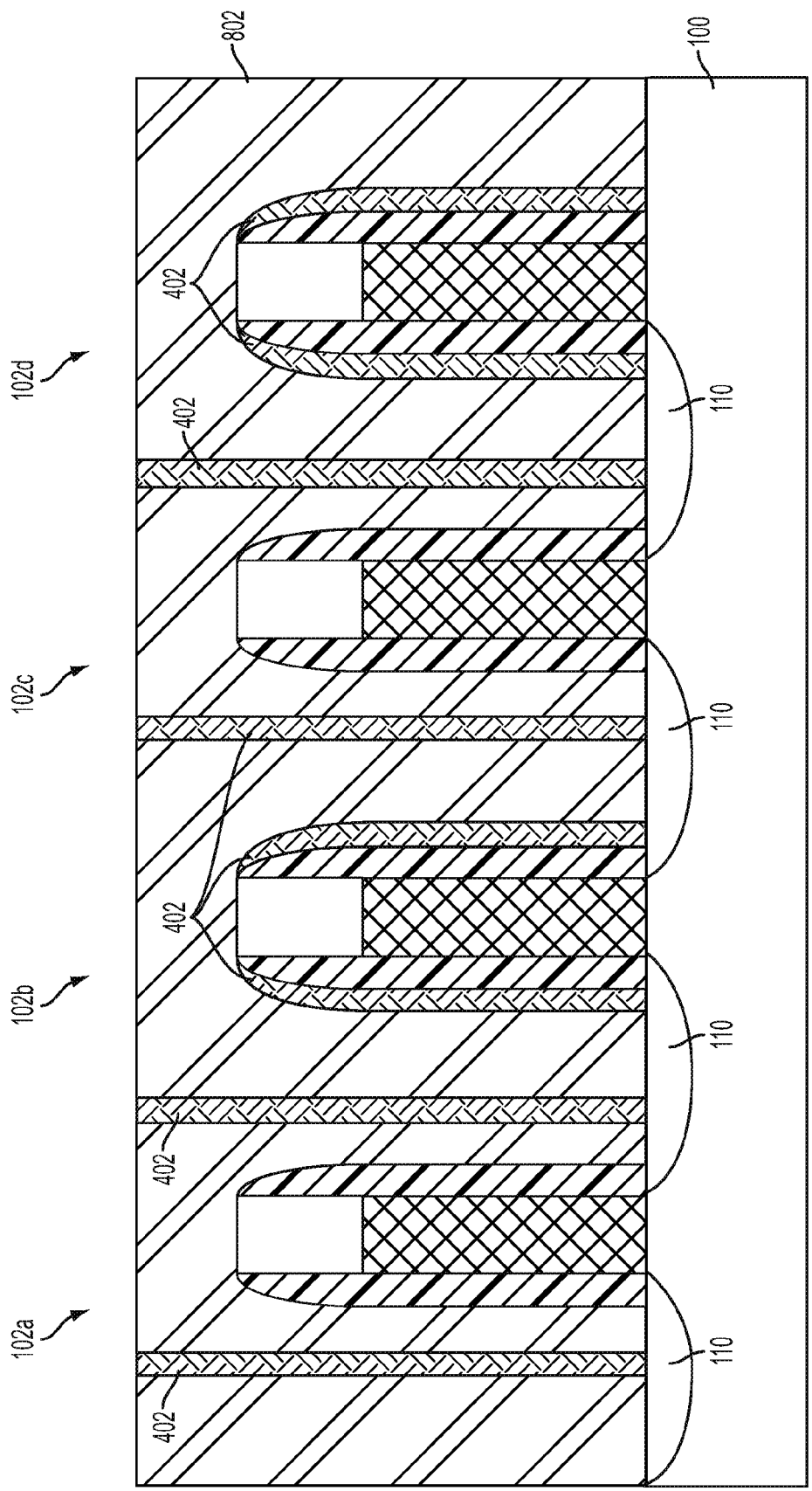
FIG. 8 illustrates the deposition of a dielectric layer.

FIG. 8 illustrates the deposition of a dielectric layer 802 (inter-layer dielectric (ILD) layer) over the exposed portions of the substrate 100, the spacer material 402 and the gate stacks 108. The dielectric layer 802 may be formed by a deposition process such as, for example, CVD, or PECVD. Following the deposition of the dielectric layer 802, a planarization process such as, for example, chemical mechanical polishing (CMP) is performed to expose top surface portions of the spacer material 402 that are spaced apart from spacers 104. In the illustrated embodiment, the dielectric layer 802 includes a material that is different from the spacer material 402. For example, if the spacer material 402 includes a nitride material, the dielectric layer 802 may include an oxide or spin-on low-k material.

Figure 9:
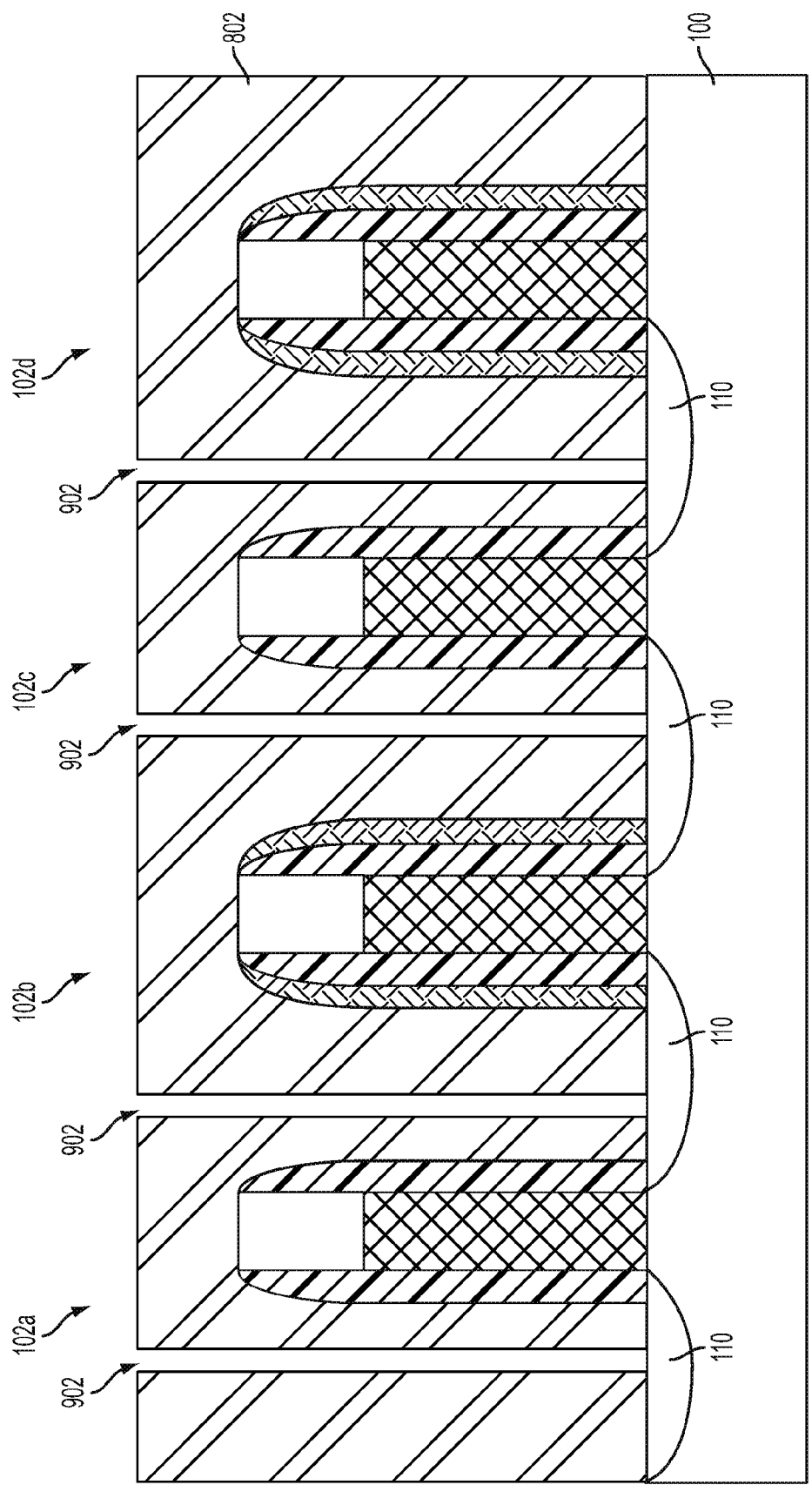
FIG. 9 illustrates the resultant structure following the removal of the exposed portions of the spacer material.

FIG. 9 illustrates the resultant structure following the removal of the exposed top portions of the spacer material 402 with a selective etching process that selectively removes the spacer material 402 and forms cavities 902 in the dielectric layer 802 that in turn expose portions of the active regions 110 in the substrate 100. The selective etching process may include, for example, a wet etching process, a dry etching process, or a combination of etching processes.

Figure 10A:
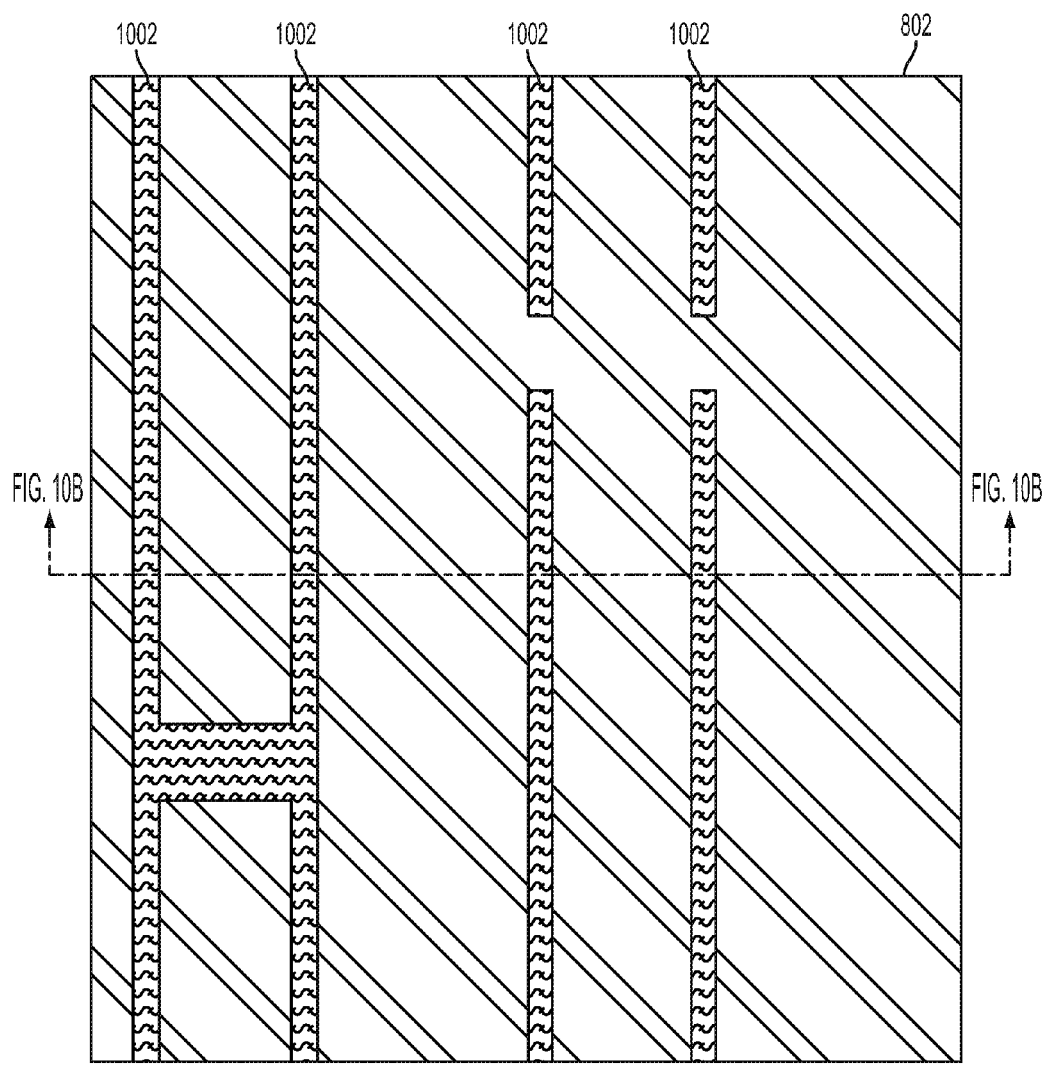
FIG. 10A illustrates a top-down view of the deposition of a conductive material in the cavities of FIG. 9.

FIG. 10A illustrates a top-down view of the deposition of a conductive material 1002 in the cavities 902 (of FIG. 9). The conductive material 1002 may include, for example, copper or silver. The conductive material 1002 may be formed by, for example, a CVD process, plasma vapor deposition, electroplating, or an electroless plating process that forms a layer of the conductive material 1002 in the cavities 902 and over the dielectric layer 802. Following the deposition of the conductive material 1002, a planarization process, such as, for example, CMP is performed that removes portions of the conductive material 1002 and exposes top portions of the dielectric layer 802.

Figure 10B:
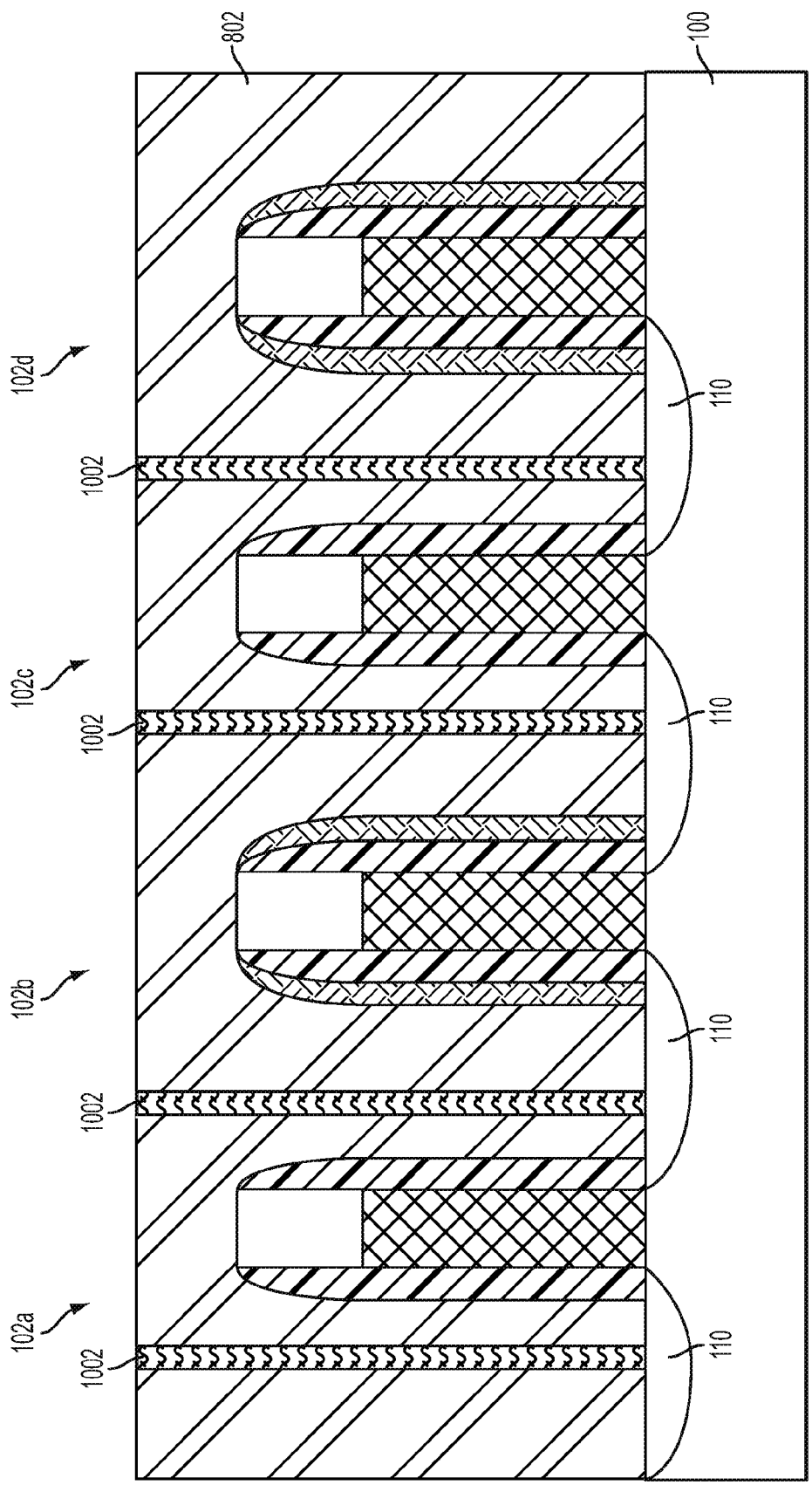
FIG. 10B illustrates a side cut-away view of the resultant structure along the line 10B of FIG. 10A.

FIG. 10B illustrates a side cut-away view of the resultant structure along the line 10B (of FIG. 10A). The conductive material 1002 defines conductive vias that contact the active regions 110 of the FET devices. Following the formation of the conductive vias, gate contacts (not shown) may be formed by, for example, a lithographic patterning and etching process that removes portions of the dielectric layer 802 and exposes portions of the gate stacks 108. The resultant cavities may be filled with a conductive material in a similar manner as described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor device comprising:
   a first gate stack disposed on a substrate;
   a first spacer including a first spacer material disposed adjacent to and in contact with the first gate stack;
   a second spacer including a second spacer material disposed adjacent to and in contact with the first spacer, the second spacer located at opposing sides of the first gate stack;
   a second gate stack disposed on the substrate;
   an active region arranged between the first gate stack and the second gate stack;
   a third spacer including the first spacer material disposed adjacent to and in contact with the second gate stack;
   a dielectric layer disposed over portions of the substrate, the active region, the first gate stack, the first spacer, the second spacer, the second gate stack, and the third spacer, the dielectric layer comprising a different material than the second spacer material; and
   a conductive material disposed in a cavity of the dielectric layer, the conductive material contacting the active region, wherein the cavity is defined by removal of vertical portions of the second spacer material not adjacent to the first spacer, such that the conductive material is self-aligned with the active region.

2. The device of claim 1, wherein the conductive material is disposed over a silicon trench isolation region, and the conductive material contacts a second active region of the substrate.

\* \* \* \* \*